United States Patent
Prajuckamol et al.

(10) Patent No.: US 11,804,421 B2
(45) Date of Patent: Oct. 31, 2023

(54) CONNECTING CLIP DESIGN FOR PRESSURE SINTERING

(71) Applicant: SEMICONDUCTOR COMPONENTS INDUSTRIES, LLC, Phoenix, AZ (US)

(72) Inventors: Atapol Prajuckamol, Klaeng (TH); Chee Hiong Chew, Seremban (MY); Yushuang Yao, Shenzhen (CN)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 286 days.

(21) Appl. No.: 17/247,200

(22) Filed: Dec. 3, 2020

(65) Prior Publication Data

US 2021/0090975 A1 Mar. 25, 2021

Related U.S. Application Data

(63) Continuation of application No. 16/145,517, filed on Sep. 28, 2018, now Pat. No. 10,861,775.

(51) Int. Cl.
*H01L 23/495* (2006.01)
*H01L 23/00* (2006.01)

(52) U.S. Cl.
CPC .. *H01L 23/49513* (2013.01); *H01L 23/49548* (2013.01); *H01L 24/29* (2013.01);
(Continued)

(58) Field of Classification Search
CPC ......... H01L 24/29; H01L 24/33; H01L 24/83; H01L 24/37; H01L 24/40; H01L 24/75; H01L 24/77; H01L 24/84; H01L 2224/32245; H01L 2224/40139; H01L 2224/40227; H01L 2224/40247; H01L 2224/40491; H01L 2224/83201; H01L 23/49524; H01L 23/49551; H01L 21/67144; H01L 24/80; H01L 23/49548; H01L 2224/83439; H01L 2224/8384;
(Continued)

(56) References Cited

U.S. PATENT DOCUMENTS

| 4,240,780 A | 12/1980 | Carcey | |
| 2008/0224282 A1* | 9/2008 | Ashida | H01L 23/49575 257/E23.044 |

(Continued)

*Primary Examiner* — Thanhha S Pham
(74) *Attorney, Agent, or Firm* — Brake Hughes Bellermann LLP

(57) ABSTRACT

A semiconductor package assembly having a connecting clip disposed on both a first material stack and a second material stack having different thicknesses and disposed on a conducting substrate. This connecting clip has a first portion disposed on to the first material stack and second portion disposed on the second material stack, such that the surfaces of the first portion and second portion opposite the conducting substrate are at the same perpendicular distance from the conducting substrate. For example, in some implementations, when the thickness of the second material stack is smaller than the thickness of the first material stack, the second portion of the connecting clip may include a vertical support disposed on the second material stack to equalize the heights of the surfaces of the first portion and second portion of the connecting clip.

28 Claims, 9 Drawing Sheets

(52) U.S. Cl.
CPC .............. *H01L 24/33* (2013.01); *H01L 24/83* (2013.01); *H01L 2224/8384* (2013.01); *H01L 2224/83439* (2013.01)

(58) Field of Classification Search
CPC . H01L 2224/29339; H01L 2224/37124; H01L 2224/37147; H01L 2224/37184; H01L 2224/40499; H01L 2224/83091
See application file for complete search history.

(56) References Cited

U.S. PATENT DOCUMENTS

| | | |
|---|---|---|
| 2008/0283579 A1 | 11/2008 | Gunturi et al. |
| 2009/0039484 A1 | 2/2009 | Mahler et al. |
| 2017/0117209 A1 | 4/2017 | Benedikt et al. |
| 2018/0166415 A1 | 6/2018 | Khaselev et al. |

* cited by examiner

CONNECTING CLIP DESIGN FOR PRESSURE SINTERING

CROSS-REFERENCE TO RELATED APPLICATIONS

This application is a continuation of, and claims priority to, U.S. patent application Ser. No. 16/145,517, filed Sep. 28, 2018, entitled "CONNECTING CLIP DESIGN FOR PRESSURE SINTERING," the contents of which are incorporated by reference in their entirety.

TECHNICAL FIELD

This description relates to pressure sintering for manufacturing semiconductor package modules.

BACKGROUND

Semiconductor devices may include semiconductor die (e.g., MOSFETs) having an electrical connection to a conducting substrate (e.g., a leadframe or direct bonded copper). A technique of providing such an electrical connection between semiconductor die and conducting substrates can include using an interconnect attached to a surface of a semiconductor die facing away from the conducting substrate. A need exists, however, for systems, methods, and apparatus to address the shortfalls of present technology and to provide other new and innovative features.

SUMMARY

In one general aspect, an apparatus can include a conducting substrate. The apparatus can also include a first material stack disposed on the conducting substrate and having a first thickness. The apparatus can further include a second material stack disposed on the conducting substrate and having a second thickness. The second material stack can be located apart from the first material stack and the second thickness can be different from the first thickness. The apparatus can further include a connecting clip including a first portion disposed on the first material stack and a second portion disposed on the second material stack. A surface of the first portion opposite the first layer of material and a surface of the second portion opposite the second layer of material can be at the same perpendicular distance from the conducting substrate.

In another general aspect, a method of forming a semiconductor device can include disposing a first material stack on a conducting substrate, the first material stack having a first thickness. The method can also include disposing a second material stack on the conducting substrate and apart from the first material stack, the second material stack having a second thickness, the second thickness being different from the first thickness. The method can further include disposing a connecting clip on the first material stack and the second material stack, the connecting clip including a first portion disposed on the first material stack and a second portion disposed on the second material stack. The method can further include performing a pressure sintering operation by applying pressure, by a top plate of a pressure sintering apparatus, to the connecting clip, the top plate being in simultaneous contact with the first portion and the second portion during the pressure sintering operation.

The details of one or more implementations are set forth in the accompanying drawings and the description below.

Other features will be apparent from the description and drawings, and from the claims.

DETAILED DESCRIPTION

Figure 1:
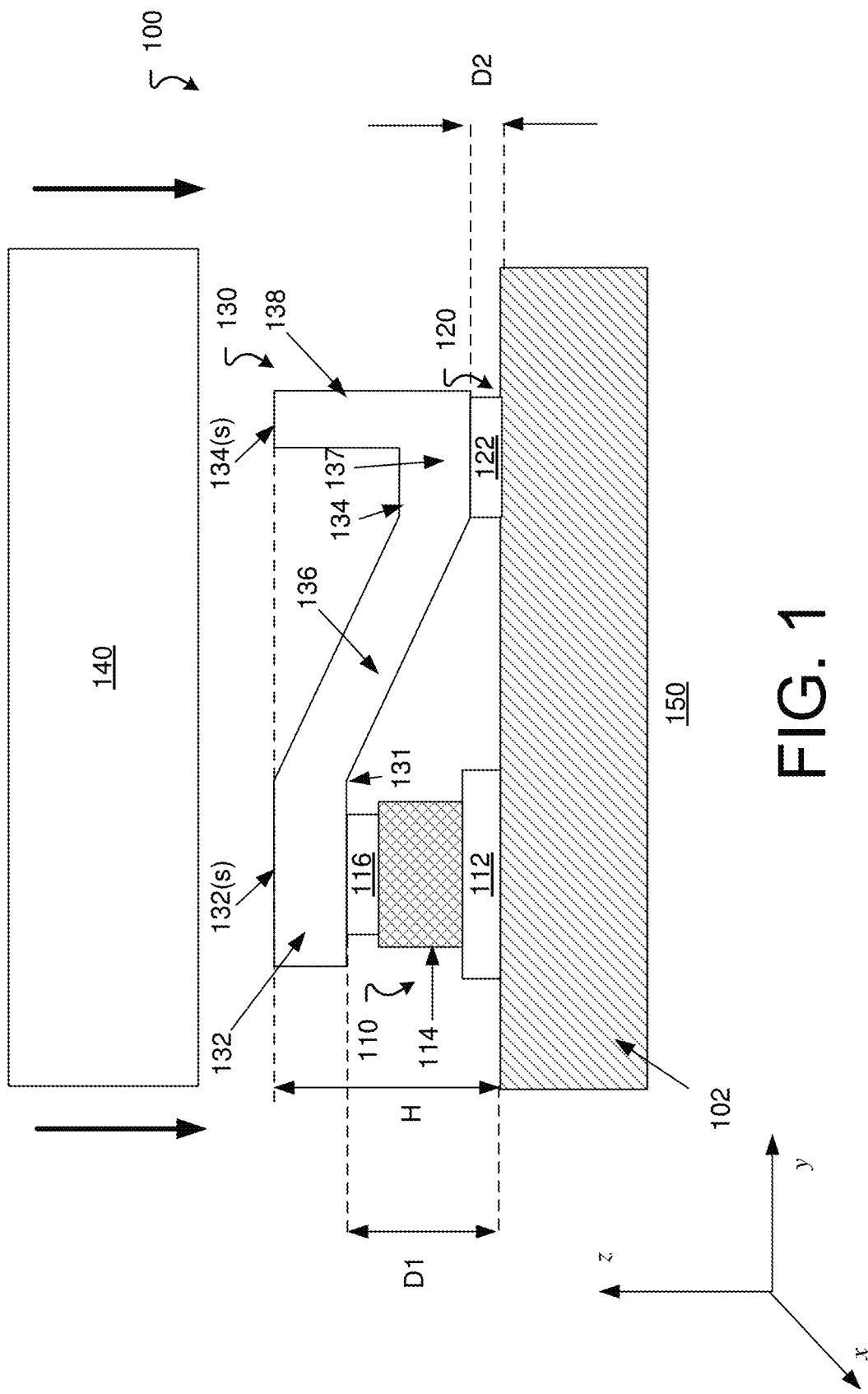
FIG. 1 is a diagram that illustrates a side view of an example improved semiconductor package assembly being manufactured within a pressure sintering apparatus.

The implementations described herein are related to an apparatus for providing an electrical connection between one or more semiconductor die and one or more conducting substrates. The apparatus can include a conducting connecting clip interconnect attached to a surface of a semiconductor die facing away from the conducting substrate. The connecting clip can provide an electrical connection between that end of the semiconductor die, the conducting substrate, and pins that connect to external components.

The semiconductor die and the connecting clip, as described herein, are attached to the conducting substrate in such a way as to provide a low resistance pathway for electricity to flow within the semiconductor device. One technique for attaching the semiconductor die and connecting clip to the conducting substrate, as described herein, is to use a pressured sintering process. In a pressured sintering process, a heat-cured sintering paste (e.g., containing silver particles) is applied between each electrical connection: between the semiconductor die and the conducting substrate, between the semiconductor die and the connecting clip, and between the connecting clip and the conducting substrate. Mechanical pressure is then applied from a surface of the connecting clip facing away from the conducting substrate in a direction toward the conducting substrate for a period of time. The applied pressure results in the semiconductor die having a bonded electrical connection to the conducting substrate via the connecting clip.

In some implementations, the improved semiconductor package assembly can have a connecting clip disposed on both a first material stack and a second material stack having different thicknesses and disposed on a conducting substrate. This connecting clip can have a first portion disposed on to the first material stack and second portion disposed on the second material stack, such that the surfaces of the first portion and second portion opposite the conducting substrate are at the same perpendicular distance from the conducting substrate. For example, in some implementations, when the thickness of the second material stack is smaller than the thickness of the first material stack, the second portion of the connecting clip may include a vertical (or substantially vertical) support disposed on the second material stack to equalize the heights of the surfaces of the first portion and second portion of the connecting clip. In some implementations, a material stack including a semiconductor die can be referred to as a semiconductor stack.

The improved semiconductor package assembly as described above is advantageous over conventional semiconductor package assemblies. Such assemblies use a connecting clip that does not have equal heights above the first material stack, which may include a semiconductor die and sintering materials, and the second material stack, which may include the sintering material only. For example, when performing a pressure sintering operation in a pressure sintering apparatus, the pressure applied over a conducting substrate by a top plate of the pressure sintering apparatus is equalized (e.g., essentially equalized) over the first and second material stacks. This equalized pressure over the material stacks of different thicknesses can at least result in better (e.g., more desirable) electrical connections between the semiconductor die and the substrate.

FIG. 1 is a diagram that illustrates a side view of an example improved semiconductor package assembly 100 being manufactured within a pressure sintering apparatus that includes a top plate 140 and bottom 150. As shown in FIG. 1, the semiconductor package assembly 100 includes a conducting substrate 102, a first material stack 110, a second material stack 120, and a connecting clip 130.

The conducting substrate 102 is configured to carry electrical current from a semiconductor die (e.g., semiconductor die 114) to a connection outside of the semiconductor package assembly 100 (e.g., a printed circuit board, not pictured). In some implementations, the conducting substrate 102 includes a portion of a leadframe. In some implementations, the conducting substrate 102 includes direct bonded copper (DBC). A DBC may be composed of a ceramic tile (e.g., alumina) with a layer (e.g., sheet) of copper bonded to one or both sides. The layer can be formed by, for example, a high-temperature oxidation process. A DBC may be desirable for use in power electronics because of, for example, its low coefficient of thermal expansion.

As shown in FIG. 1, the conducting substrate 102 is disposed on a bottom 150 of the pressure sintering apparatus.

As shown in FIG. 1, the first material stack 110 includes a semiconductor die 114, disposed between (e.g., sandwiched between) a first sintering material layer 112 and a second sintering material layer 116. In some implementations, the semiconductor die 114 is a functional electronic device previously cut (e.g., singulated) from a semiconductor wafer (e.g., Si, GaAs, SiGe, etc.). The semiconductor die 114 includes a set of layers connected to each other via vertical (or substantially vertical) interconnects. For example, the set of layers can include one or more metal layers, a gate layer, and one or more via layers.

Each of the first sintering material layer 112 and a second sintering material layer 116 is configured to provide an electrically conducting bond between the semiconductor die 114 and another electrically conducting material. For example, the first sintering material layer 112 is configured to provide between a first surface (i.e., facing toward the conducting substrate 102) of the semiconductor die 114 and the conducting substrate 102, and the second sintering material layer 112 is configured to provide between electrodes (e.g., a gate, a source, and/or a drain of in the case that the semiconductor die includes a MOSFET) of a second surface (i.e., facing away from the conducting substrate 102) of the semiconductor die 114 and the connecting clip 130. In some implementations, each of the first sintering material layer 112 and a second sintering material layer 116 can be a paste that includes silver particles (or nanoparticles) and is porous so that, upon application of pressure by the top plate 140 and bottom plate 150, a desirable (e.g., robust) electrical connection is formed between the semiconductor die 114 and the conducting substrate 102 and the connecting clip 130, respectively. In some implementations, each of the first sintering material layer 112 and a second sintering material layer 116 is heated prior to pressure being applied by the top plate 140 and bottom plate 150.

The second material stack 120 is disposed between (e.g., sandwiched between) the conducting substrate 102 and the connecting clip 130, and apart from the first material stack 110 along the surface of the conducting substrate 102.

FIG. 1 also shows a coordinate system in which the z coordinate is aligned with an axis of the first material stack 110 and an axis of the second material stack. In some implementations, the z coordinate is aligned with a vertical direction, which in turn is aligned parallel (or antiparallel) to the direction of gravity. Further, the y coordinate may be aligned along the direction parallel to the surface of the conducting substrate 102.

As shown in FIG. 1, the second material stack includes a sintering material layer 122. As with the first sintering material layer 112 and the second sintering material layer 116 of the first material stack 110, the sintering material layer 122 can be a paste that includes silver particles (or nanoparticles) and is porous so that, upon application of pressure by the top plate 140 and bottom plate 150, a desirable (e.g., robust) electrical connection is formed between the connecting clip 130 and the conducting substrate 102. In some implementations, the pressure applied by the top plate 140 is between 2 MPa and 100 MPa. In some implementations, the pressure is applied by the top plate 140 for a time between 30 seconds and 600 seconds.

The connecting clip 130 is configured to form an electrical connection between the electrodes on the second surface of the semiconductor die 114 and the conducting substrate 102. The connecting clip 130 includes a material that is a good conductor. In some implementations, the connecting clip 130 includes copper and, in such an implementation, may be referred to as a copper clip. In some implementations, the connecting clip 130 includes one or more of aluminum, tungsten, copper, and the like.

The connecting clip 130 can define (e.g., form) an electrical connection, as described above, based on its geometry and the fact that it is a continuous structure. This connection is provided by an obtuse-angled shoulder 136 (i.e., having an obtuse angle 131 with respect to the surface 132(s)) that provides a structural element of the connecting clip connecting the first portion 132 to a second portion 134 of the connecting clip 130. The first portion 132 of the connecting clip 130 is in contact with the second sintering material layer 116 and has a surface 132(s) facing away from the conducting substrate 102. The second portion 134 of the connecting clip 130 is in contact with the sintering material layer 122 and has a surface 134(s) facing away from the conducting substrate 102. In some implementations, the surfaces 132(s) and 134(s) is substantially parallel to the surface of the conducting substrate 102. In some implementations, the area of the surface 134(s) is different than the area of the surface 132(s).

As shown in FIG. 1, the second portion 134 includes a foot 137 in contact with the sintering material layer 122 and a support 138. The support 138 is aligned along the z-direction as shown in FIG. 1. The support 138 provides the physical support to equalize (or substantially equalize) the pressure from the top plate 140 on the first material stack 110 and the second material stack 120 despite the difference in their respective thicknesses. As also shown in FIG. 1, the support 138 is configured such that the surface 134(s) of the second portion 134 is at the same distance H (e.g., perpendicular distance) from the conducting substrate 102 as the surface 132(s) of the first portion 132.

The connecting clip 130 shown in FIG. 1 is in contrast to conventional connecting clips which do not have a vertical support such as the vertical support 138. Accordingly, when sintering paste is applied to surfaces of the connecting clip apart from the obtuse-angled shoulder and facing toward the conducting substrate, the pressure applied to the second material stack 120 will likely be significantly different from the pressure applied to the first material stack 110. Such non-uniform pressure applied to the material stacks 110 and 120 may result in a poor connection between electrodes of the semiconductor die 114 and the conducting substrate 102.

In some implementations, the conducting substrate has a thickness less than, for example, 1 millimeter (mm). In some implementations, the conducting substrate has a thickness between, for example, 0.1 mm and 0.6 mm. In some implementations, the cross-sectional area of the semiconductor die 114 can be between 1 $mm^2$ and 1000 $mm^2$. In some implementations, the cross-sectional area of the semiconductor die 114 can be smaller than 225 $mm^2$. In some implementations, the thickness of the semiconductor die 114 is less than 1 mm. In some implementations, the thickness of the semiconductor die 114 is less than 0.5 mm. In some implementations, the thickness of the semiconductor die 114 is between 0.1 mm and 0.3 mm. In some implementations, the first sintering material layer 112 has a cross-sectional area of, for example, between about 200 $mm^2$ and 600 $mm^2$. In some implementations, the second sintering material layer 116 has a cross-sectional area of, for example, between 100 $mm^2$ and 400 $mm^2$. In some implementations, each of the first sintering material layer 112 and a second sintering material layer 116 has a thickness of less than 0.1 mm. In some implementations, each of the first sintering material layer 112 and a second sintering material layer 116 has a thickness of about 0.02 mm. In some implementations, the sintering material layer 122 has a cross-sectional area depending upon the geometry of the connecting clip 130. In some implementations, the sintering material layer 122 has a thickness of less than 0.1 mm. In some implementations, the sintering material layer 122 has a thickness of about 0.02 mm. In some implementations, the distance between the material stack 110 and the material stack 120 (e.g., as measured with respect to their inner edges) is less than 0.5 mm. In some implementations, the distance between the material stack 110 and the material stack 120 is between 0.3 mm and 0.4 mm. For the specific connecting clip 130 illustrated in FIG. 1, the cross-sectional area can be, in some implementations, between 20 $mm^2$ and 200 $mm^2$. The thickness of the connecting clip 130 is, in some implementations, between 0.1 and 0.5 mm over the length of the connecting clip 130.

The geometry of the connecting clip 130 is not the only possible geometry that can provide an improved connection between electrodes of the semiconductor die 114 and the conducting substrate 102. Other possible example geometric embodiments are described in connection with at least FIGS. 2-8.

Figure 2:
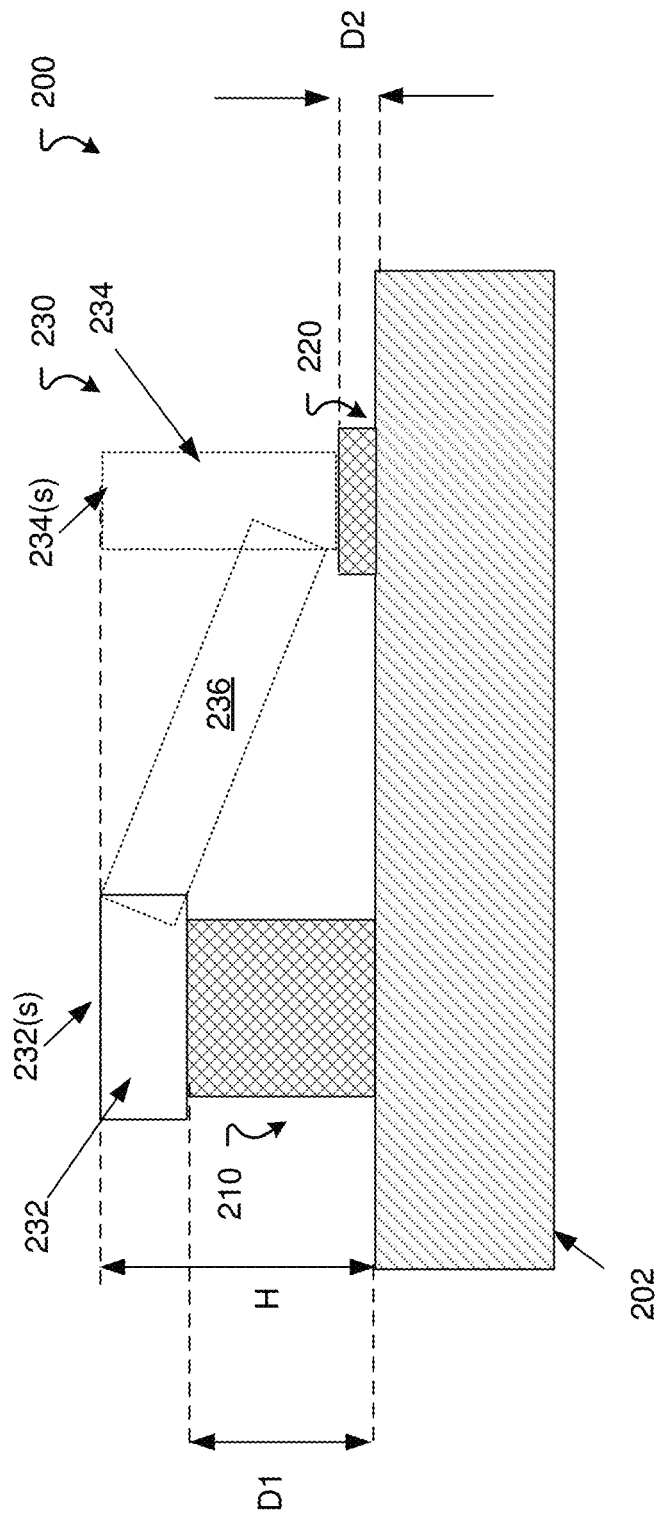
FIG. 2 is a diagram that illustrates a side view of an example generic, improved semiconductor package assembly.

FIG. 2 is a diagram that illustrates a side view of an example generic, improved semiconductor package assembly 200. As shown in FIG. 2, the semiconductor package assembly 200 includes a conducting substrate 202, a first material stack 210, a second material stack 220, and a connecting clip 230. The conducting substrate 202 is analogous to the conducting substrate 102 shown in FIG. 1.

The first material stack 210 and the second material stack 220 are shown in FIG. 2 as generic material stacks. In some implementations, each of the first material stack 210 and the second material stack 220 may include some sintering material as shown in FIG. 1 (e.g., sintering material layers 112, 116, and 122). In some implementations, the first material stack includes some semiconductor device that is to be connected to the conducting substrate 202 via the connecting clip 230 via a pressure sintering operation. The first material stack 210 has a thickness D1 and the second material stack 220 has a thickness D2 which is different from D1. As shown in FIG. 2, D1 is greater than D2.

As shown in FIG. 2, the connecting clip 230 includes a first portion 232, a second portion 234, and a connecting portion 236 that joins the first portion 232 to the second portion 234. The first portion 232 is analogous to the first portion 132 of the connecting clip 130 shown in FIG. 1. In FIG. 2, however, the second portion 234 and the connecting portion 236 are shown as dotted rectangles to represent generic geometries that may be used in the connecting clip 230.

The second portion 234 of the connecting clip 230 is shown in FIG. 2 as a dotted rectangle having a surface 234(s) opposite the conducting substrate 202. The second portion 234 has a constraint to have a thickness such that the perpendicular distance of the surface 234(s) from the conducting substrate 202 is the same (H) as the perpendicular distance from the surface 232(s) from the conducting substrate 202. In this way, when the conducting substrate 202 is flat, both surfaces 232(s) and 234(s) will be in simultaneous contact with the top plate (e.g., top plate 140) of a pressure sintering apparatus. As is shown in FIGS. 3-7, there are many such geometries that achieve this constraint.

The connecting portion 236 of the connecting clip is shown in FIG. 2 as a dotted rectangle in contact with both the first portion 232 and the second portion 234 to represent a generic bridge providing electrical and physical contact between the first portion 232 and the second portion 234. As is seen in FIGS. 3-7, the geometry of the connecting portion 236, in some implementations, depends on the geometry of the second portion 234. In some implementations, the reverse is true: the geometry of the second portion 234 depends on the geometry of the connecting portion 236.

Figure 3:
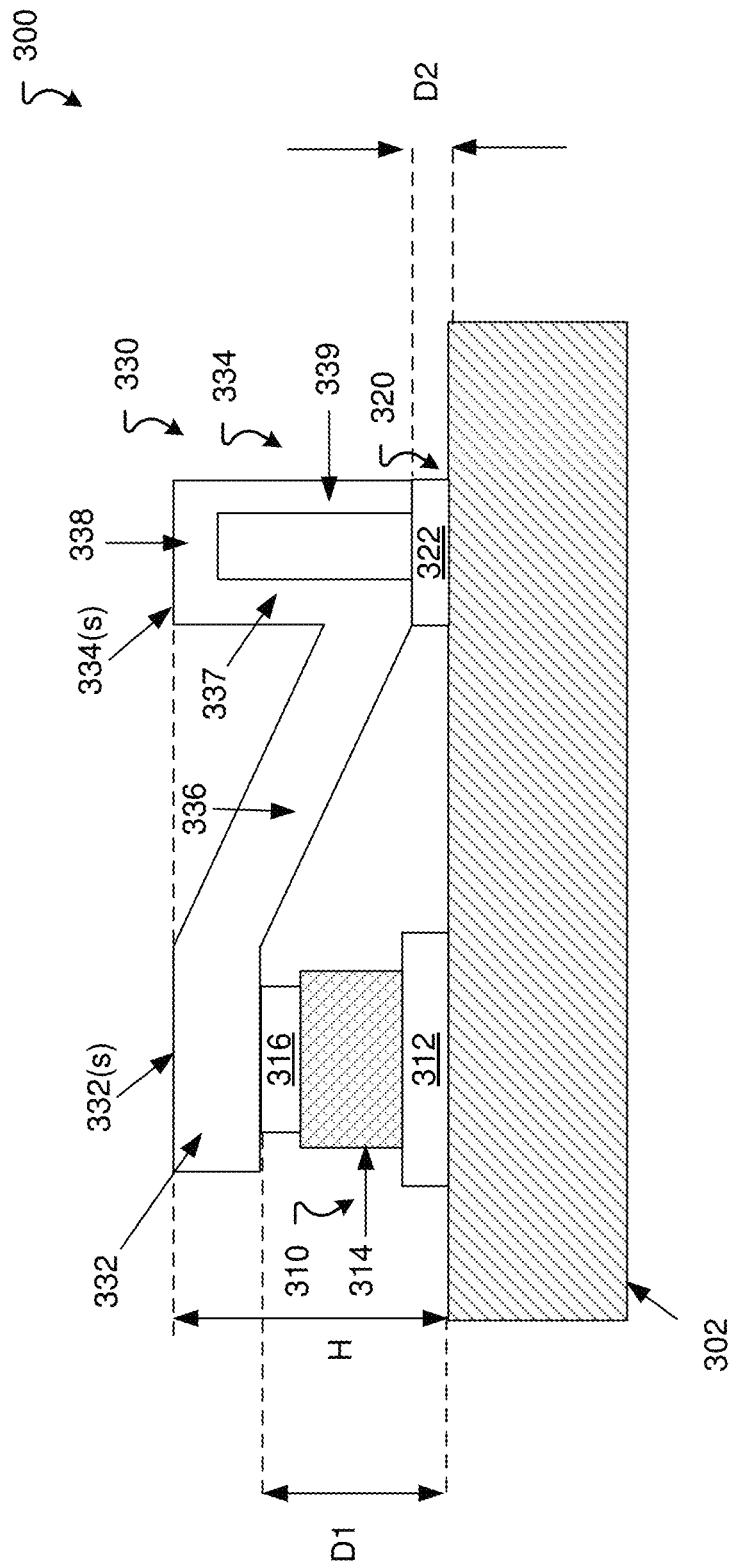
FIGS. 3-8 are diagrams that illustrate side views of example improved semiconductor package assemblies.

FIG. 3 is a diagram that illustrates a side view of an example improved semiconductor package assembly 300 and is a variation of at least FIGS. 1 and 2. Similar reference numerals imply similar elements. As shown in FIG. 3, the semiconductor package assembly 300 includes a conducting substrate 302, a first material stack 310, a second material stack 320, and a connecting clip 330. The conducting substrate 302 is analogous to the conducting substrate 102 shown in FIG. 1. Further, the first material stack 310 is analogous to the first material stack 110, the second material stack 320 is analogous to the second material stack 120, and the first portion 332 of the connecting clip 330 is analogous to the first portion 132 of the connecting clip 130.

As shown in FIG. 3, the second portion 334 of the connecting clip 330 has an upside-down "U" shape and has three portions (e.g., pieces): a first member 337, a second member 339, and a bridge 338. The first member 337 provides a first vertical support for the connecting clip 330 and the second member 339 provides a second vertical support for the connecting clip 330. Further, the first member 337 and the second member 339 provide electrical connections between the first portion 332 and the sintering material 322 of the second material stack 320. The bridge 338 is connected to the first member 337 and the second member 339. The bridge 338 provides the surface 234(s) over which the top plate of a sintering apparatus may apply direct contact and also an electrical connection between the first member 337 and the second member 339. The width of each of the first member 337 and the second member 339 is, in some implementations, between 0.05 mm and 0.1 mm. The thickness of the bridge is, in some implementations, between 0.1 mm and 0.3 mm. In some implementations, the members can be referred to as leg members.

The connecting portion 336 of the connecting clip 330 as shown in FIG. 3 is, as in FIG. 1, an obtuse-angled shoulder connected to the first portion 332 and a part of the member 337 adjacent to the second material stack 320. This connecting portion 336 is accordingly connected to the bottom of the first member 337 and provides a robust connection to the conducting substrate 302 vis the second material stack 322.

Figure 4:
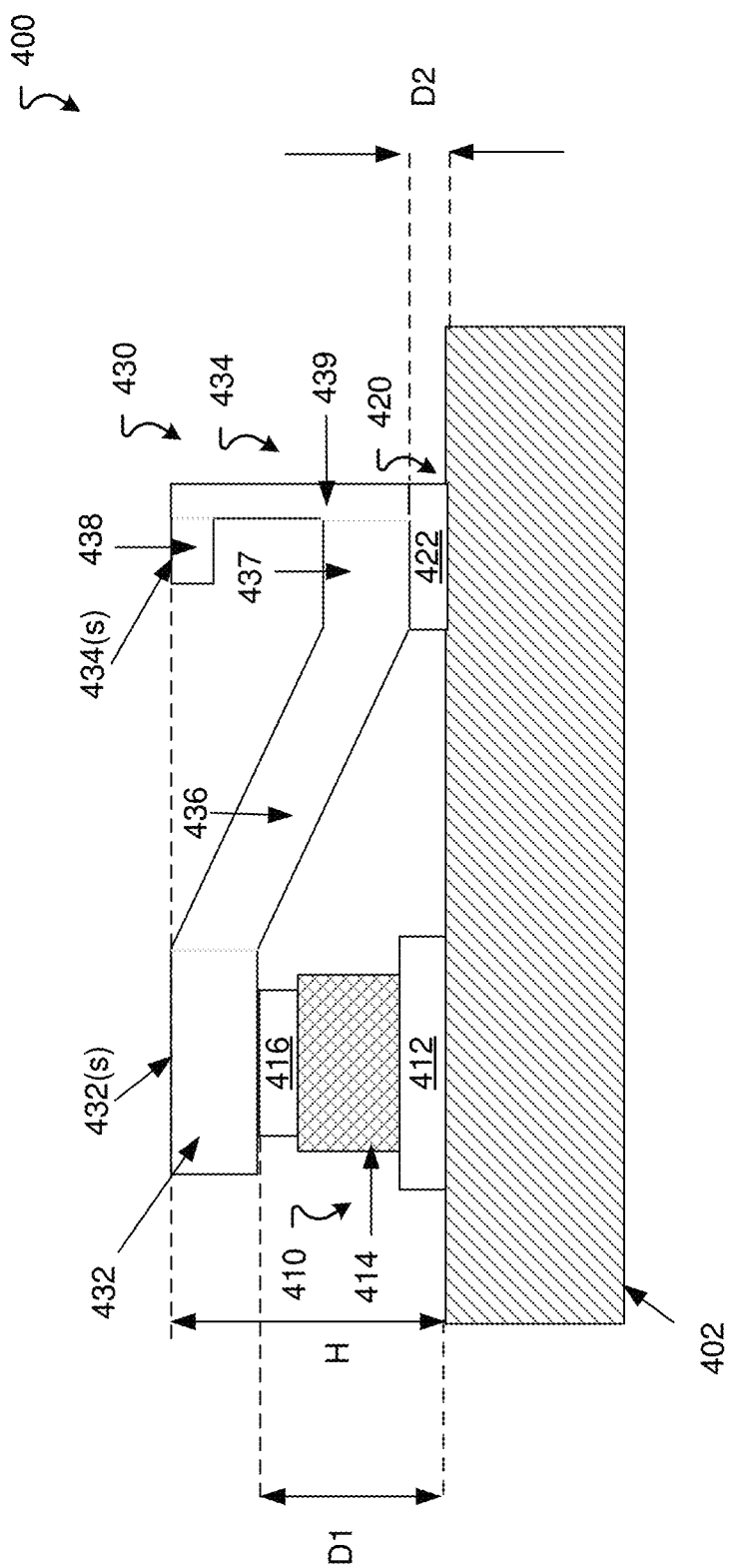

FIG. 4 is a diagram that illustrates a side view of another example improved semiconductor package assembly 400 and is a variation of at least FIGS. 1 and 2. Similar reference numerals imply similar elements. As shown in FIG. 4, the semiconductor package assembly 400 includes a conducting substrate 402, a first material stack 410, a second material stack 420, and a connecting clip 430. The conducting substrate 402 is analogous to the conducting substrate 102 shown in FIG. 1. Further, the first material stack 410 is analogous to the first material stack 110, the second material stack 420 is analogous to the second material stack 120, and the first portion 432 of the connecting clip 330 is analogous to the first portion 132 of the connecting clip 130. Further, the connecting portion 436 of the connecting clip is an obtuse-angled shoulder connected to the first portion 432 and adjacent to the second material stack 420.

As shown in FIG. 4, the second portion 434 of the connecting clip 430 has a first foot 437, a second foot 438, and a member 439. The first foot 437 is connected to the connecting portion 436 and the second material stack 420. The second foot 439 provides the surface 434(s) over which the top plate of a sintering apparatus may apply direct contact. The member 439 provides a connection between the first foot 437 and the second foot 439 as well as the support needed to withstand the pressure provided by the top plate of the sintering apparatus. In some implementations, the thicknesses of the first foot 437 and the second foot 438 are each between 0.1 mm and 0.3 mm. In some implementations, the width of the member 439 is between 0.05 mm and 0.3 mm.

Figure 5:
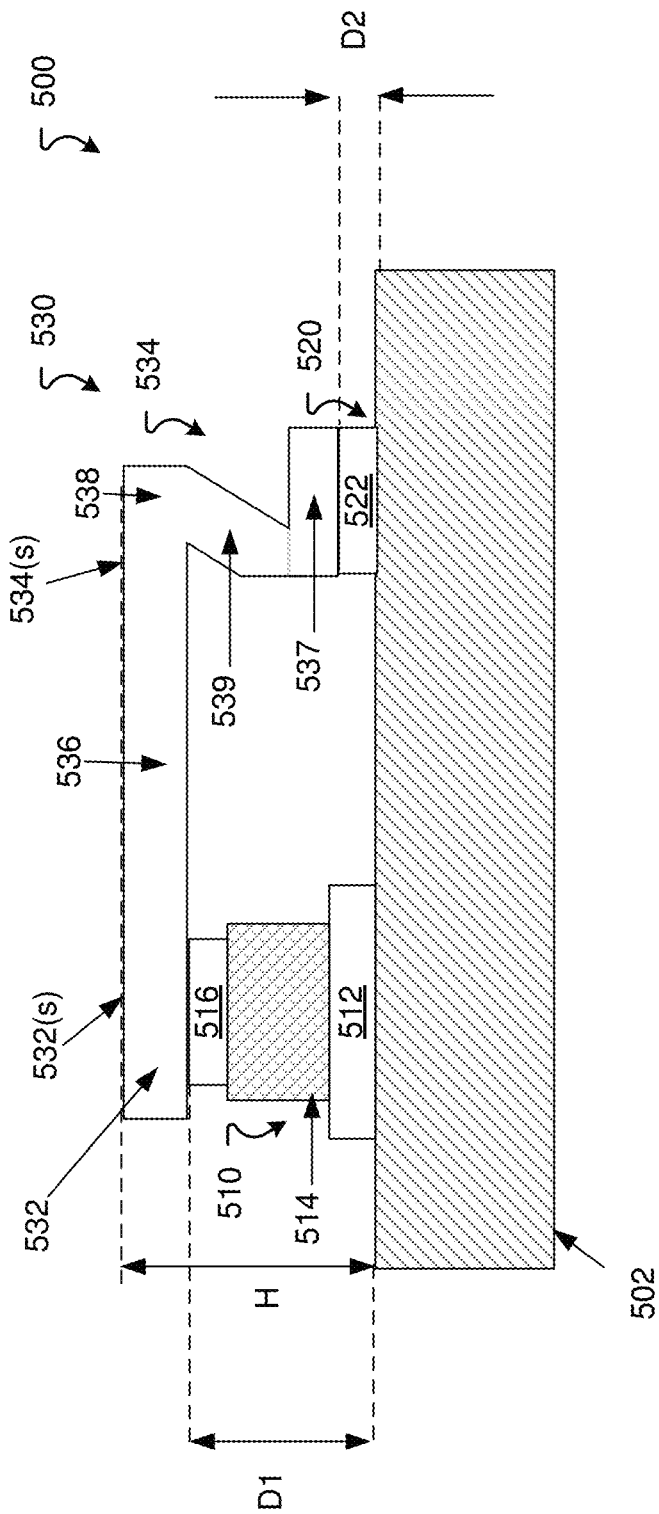

FIG. 5 is a diagram that illustrates a side view of another example improved semiconductor package assembly 500 and is a variation of at least FIGS. 1 and 2. Similar reference numerals imply similar elements. As shown in FIG. 5, the semiconductor package assembly 500 includes a conducting substrate 502, a first material stack 510, a second material stack 520, and a connecting clip 530. The conducting substrate 502 is analogous to the conducting substrate 102 shown in FIG. 1. Further, the first material stack 510 is analogous to the first material stack 110, the second material stack 520 is analogous to the second material stack 120, and the first portion 532 of the connecting clip 530 is analogous to the first portion 132 of the connecting clip 130.

As shown in FIG. 5, the second portion 434 of the connecting clip 430 has a first foot 537, a second foot 538, and a bridge 539. In this case, the bridge 539 takes the form of an acute-angled elbow that connects a far edge of the second foot 538 with a near edge of the first foot 537. That is, the bridge 539 connects the side of the first foot 537 nearest the first material stack 510 with the side of the second foot 538 furthest from the first material stack 520. Also as shown in FIG. 5, junctions between the bridge 539 and each of the first foot 537 and the second foot 538 are perpendicular to the conducting substrate 502 and provide stability to the second portion 534 under pressure from the top plate of a sintering apparatus. In some implementations, each of the first foot 537 and the second foot 538 is between 0.1 mm and 0.3 mm. In some implementations, the width of the bridge 539 is between 0.1 mm and 0.3 mm.

The connecting portion 536 is oriented parallel to the conducting substrate 502 and has a surface that, with the surfaces 532(s) and 534(s), forms a single surface of contact with the top plate of a pressure sintering apparatus, at a perpendicular distance H from the conducting substrate. Such an arrangement may be advantageous in distributing larger pressures from a top plate equitably over the connecting clip 530 and therefore provide better electrical connections between the semiconductor die 516 and the conducting plate 502.

Figure 6:
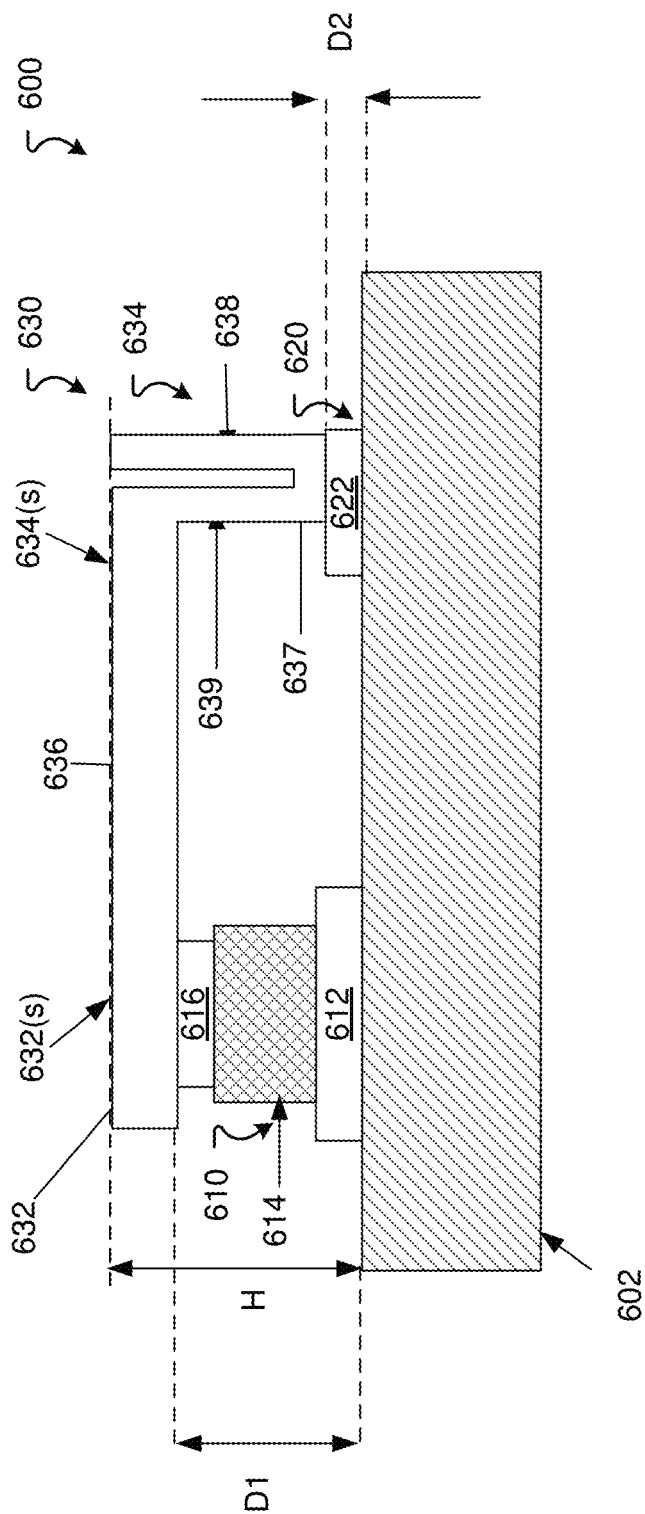

FIG. 6 is a diagram that illustrates a side view of another example improved semiconductor package assembly 600 and is a variation of at least FIGS. 1 and 2. Similar reference numerals imply similar elements. As shown in FIG. 6, the semiconductor package assembly 600 includes a conducting substrate 602, a first material stack 610, a second material stack 620, and a connecting clip 630. The conducting substrate 602 is analogous to the conducting substrate 102 shown in FIG. 1. Further, the first material stack 610 is analogous to the first material stack 110, the second material stack 620 is analogous to the second material stack 120, and the first portion 632 of the connecting clip 630 is analogous to the first portion 132 of the connecting clip 130.

As shown in FIG. 6, the second portion 634 of the connecting clip 630 has a first member 639, a second member 638, and a bridge 637 arranged in a "U" shape. The first member 639 provides a first support for the connecting clip 630 and the second member 638 provides a second vertical for the connecting clip 630. The bridge 637 is connected to the first member 639 and the second member 638. Further, the bridge 637 is disposed on the second material stack 620. The width of each of the first member 639 and the second member 638 is, in some implementations, between 0.05 mm and 0.1 mm. The thickness of the bridge 637 is, in some implementations, between 0.1 mm and 0.3 mm. As shown in FIG. 6, the width of the bridge 637 may be less than a width of the material stack 620. In some implementations, the width of the bridge 637 is substantially equal to a width of the material stack 620.

The connecting portion 636 is oriented parallel to the conducting substrate 602 and has a surface that, with the surfaces 632(s) and 634(s), forms a surface of contact with the top plate of a pressure sintering apparatus having a hole corresponding to the space between the first member 639 and the second member 638, at a perpendicular distance H from the conducting substrate. Such an arrangement may be advantageous in distributing larger pressures from a top plate equitably over the connecting clip 630 and therefore provide better electrical connections between the semiconductor die 616 and the conducting plate 602.

Figure 7:
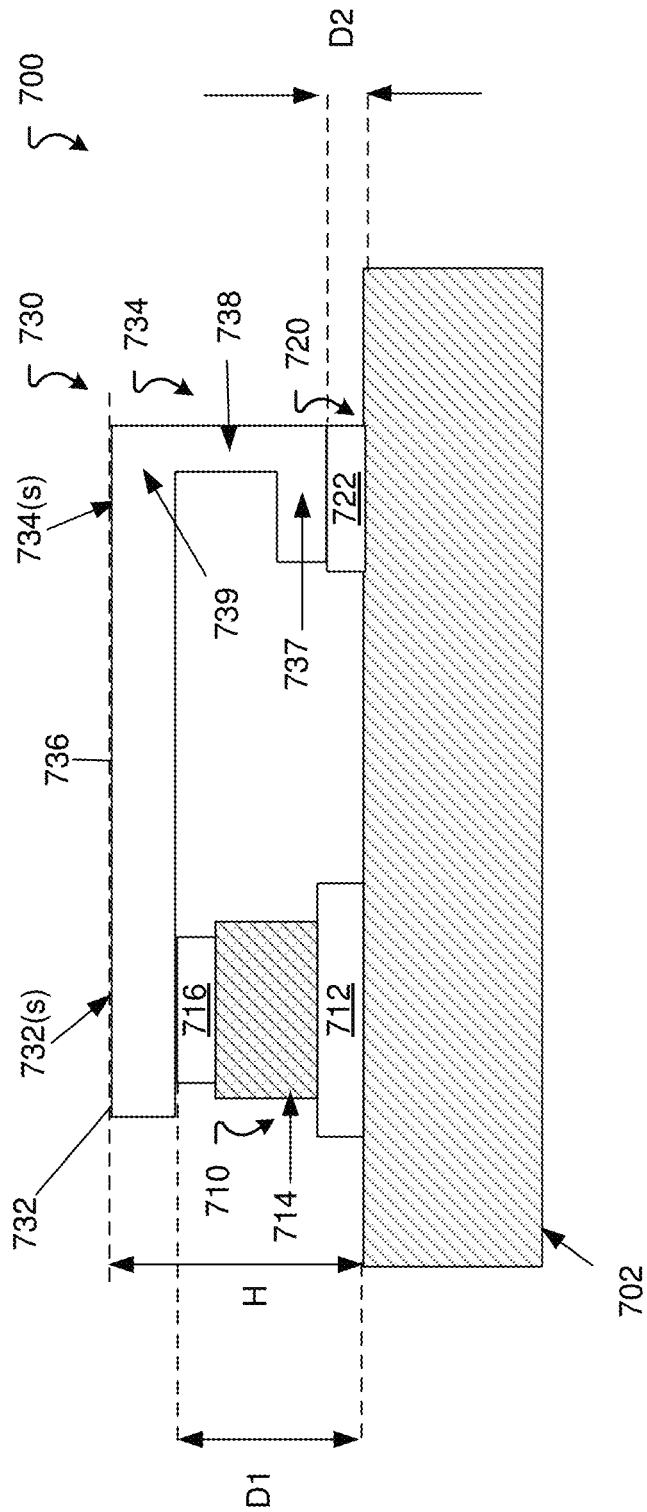

FIG. 7 is a diagram that illustrates a side view of another example improved semiconductor package assembly 700 and is a variation of at least FIGS. 1 and 2. Similar reference numerals imply similar elements. As shown in FIG. 7, the semiconductor package assembly 700 includes a conducting substrate 702, a first material stack 710, a second material stack 720, and a connecting clip 730. The conducting substrate 702 is analogous to the conducting substrate 102 shown in FIG. 1. Further, the first material stack 710 is analogous to the first material stack 110, the second material stack 720 is analogous to the second material stack 120, and the first portion 732 of the connecting clip 730 is analogous to the first portion 132 of the connecting clip 130.

As shown in FIG. 7, the second portion 734 of the connecting clip 730 has a first foot 737, a second foot 739, and a member 738 connecting the first foot 737 and the second foot 739. The first foot 737 is disposed on the second material stack 720. As shown in FIG. 7, the width of the first foot 737 is substantially equal to a width of the second material stack 720. In some implementations, the width of the first foot 737 is less than the width of the second material stack 720. In some implementations, each of the first foot 737 and the second foot 739 is between 0.1 mm and 0.3 mm. In some implementations, the width of the bridge 738 is between 0.05 mm and 0.3 mm.

The connecting portion 736 is oriented parallel to the conducting substrate 502 and has a surface that, with the surfaces 732(s) and 734(s), forms a single surface of contact with the top plate of a pressure sintering apparatus, at a perpendicular distance H from the conducting substrate. Such an arrangement may be advantageous in distributing larger pressures from a top plate equitably over the connecting clip 730 and therefore provide better electrical connections between the semiconductor die 716 and the conducting plate 702.

The embodiments shown in FIGS. 1 and 3-7 represent possible connecting clips that are improvements over conventional arrangements. Such arrangements, however, are not the only possible geometries. In some implementations, certain geometries may be derived using an optimization process based on merit functions involving pressure distribution and material cost.

Figure 8:
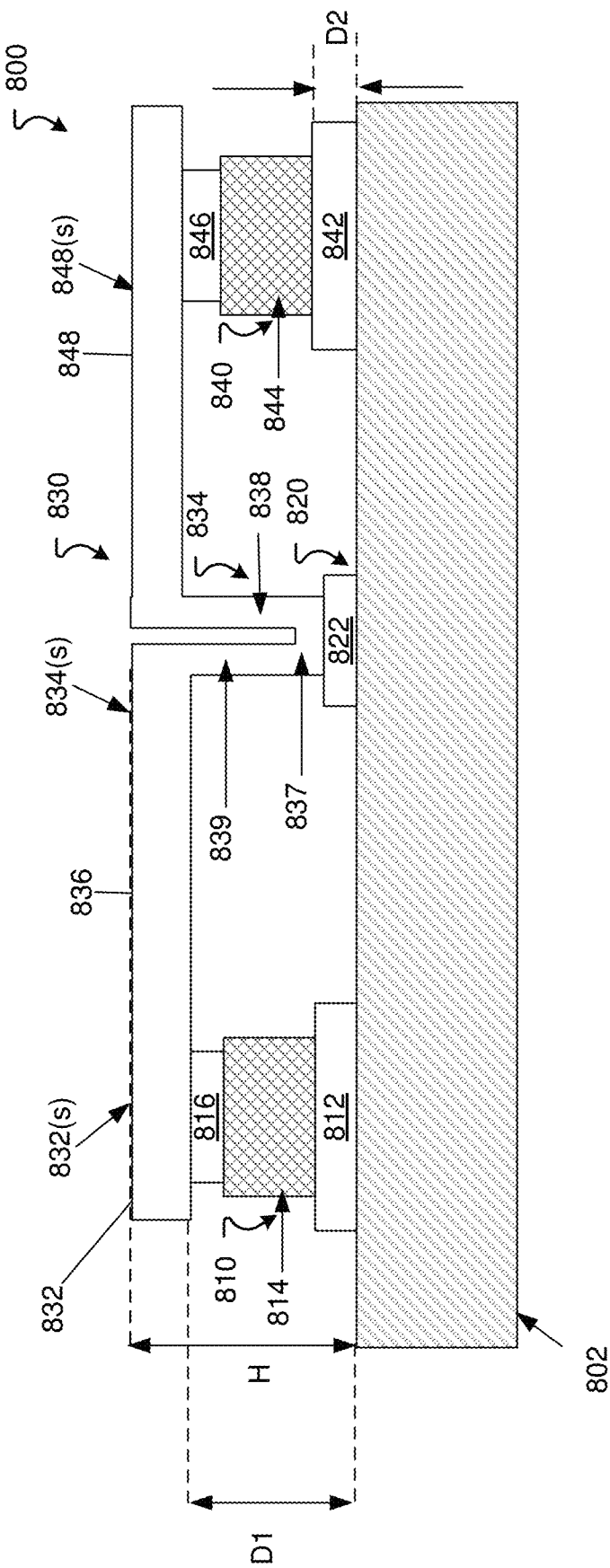

FIG. 8 is a diagram that illustrates a side view of another example improved semiconductor package assembly 800 and is a variation of, for example, FIG. 6 in that there are multiple dies. Similar reference numerals imply similar elements. As shown in FIG. 8, the semiconductor package assembly 800 includes a conducting substrate 802, a first material stack 810, a second material stack 820, a connecting clip 830, and a third material stack 840. The conducting substrate 802 is analogous to the conducting substrate 102 shown in FIG. 1. Further, the first material stack 810 is analogous to the first material stack 110, the second material stack 820 is analogous to the second material stack 120, and the first portion 832 of the connecting clip 830 is analogous to the first portion 132 of the connecting clip 130. In addition, the third material stack 840, as shown in FIG. 8, is similar to the first material stack 810 in that it contains a first sintering material layer 842, a semiconductor die 844, and a second sintering material layer 846, all of similar dimensions as the first sintering material layer 812, semiconductor die 814, and second sintering material layer 816. In some implementations, however, the third material stack 840 can have a different size and/or components than the first material stack 810.

As shown in FIG. 8, the second portion 834 of the connecting clip 830 has a first member 839, a second member 838, and a bridge 837 arranged in a "U" shape. The first member 839 provides a first support for the connecting clip 830 and the second member 838 provides a second support for the connecting clip 830. The bridge 837 is connected to the first member 839 and the second member 838. Further, the bridge 837 is disposed on the second material stack 820. The width of each of the first member 839 and the second member 838 is, in some implementations, between 0.05 mm and 0.1 mm. The thickness of the bridge 837 is, in some implementations, between 0.1 mm and 0.3 mm. As shown in FIG. 8, the width of the bridge 837 may be less than a width of the material stack 820. In some implementations, the width of the bridge 837 is substantially equal to a width of the material stack 820.

The connecting portion 836 is oriented parallel to the conducting substrate 802 and has a surface that, with the surfaces 832(s) and 834(s), forms a surface of contact with the top plate of a pressure sintering apparatus having a hole corresponding to the space between the first member 839 and the second member 838, at a perpendicular distance H from the conducting substrate. Such an arrangement may be advantageous in distributing larger pressures from a top plate equitably over the connecting clip 830 and therefore provide better electrical connections between the semiconductor die 816 and the conducting plate 802.

In addition, the connecting clip 830 includes a third portion 848. As shown in FIG. 8, the third portion 848 is oriented parallel to the conducting substrate 802 and has a surface 848(s) that also forms a surface of contact with the top plate of a pressure sintering apparatus. Because FIG. 8 shows the third material stack 840 as similar to the first material stack 810, the third portion 848 is similar to the first portion 832 of the connecting clip 830. In some implementations, however, the third portion 848 is not similar to the first portion 832 and alternative geometric configurations may be considered for the third portion 848.

Figure 9:
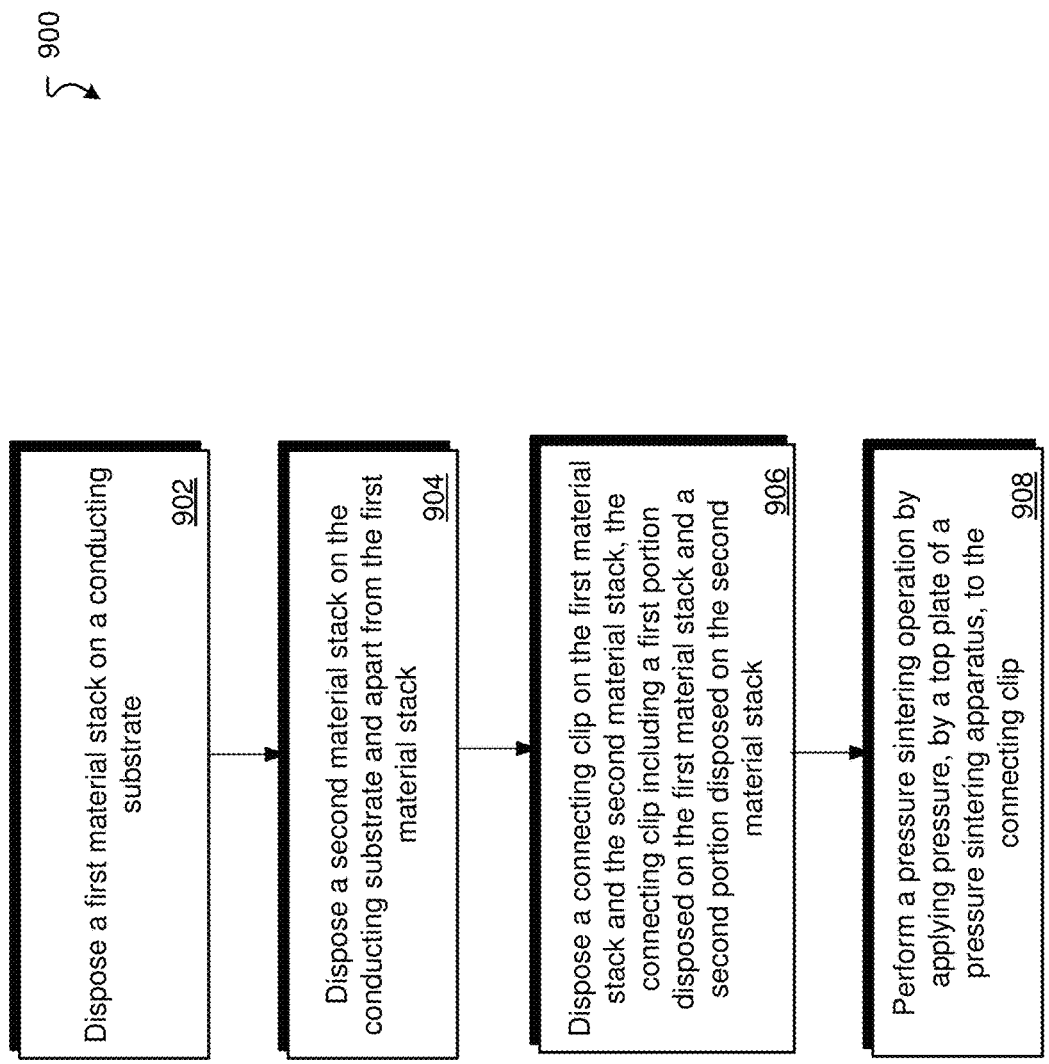
FIG. 9 is a flow chart that illustrates an example method of performing a pressed sintering operation according to the improved techniques disclosed herein.

FIG. 9 is a flow chart that illustrates an example method 800 of performing a pressed sintering operation.

At 902, a first material stack (e.g., first material stack 210 of FIG. 2) is disposed on a conducting substrate (e.g., conducting substrate 202), the first material stack having a first thickness D1. In some implementations, the first material stack includes a semiconductor die and sintering material layers on the surfaces of the semiconductor die.

At 904, a second material stack (e.g., second material stack 220 of FIG. 2) is disposed on the conducting substrate and apart from the first material stack, the second material stack having a second thickness D2, the second thickness being different from the first thickness. In some implementations, the second material stack only includes a sintering material layer and accordingly D2 is less than D1.

At 906, a connecting clip (e.g., connecting clip 230) is disposed on the first material stack and the second material stack, the connecting clip including a first portion (e.g., first portion 232) disposed on the first material stack and a second portion (e.g., second portion 234) disposed on the second material stack.

At 908, a pressure sintering operation is performed by applying pressure, by a top plate (e.g., top plate 140) of a pressure sintering apparatus, to the connecting clip, the top plate being in simultaneous contact with the first portion and the second portion during the pressure sintering operation.

A number of embodiments have been described. Nevertheless, it will be understood that various modifications may be made without departing from the spirit and scope of the specification.

It will also be understood that when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

The various apparatus and techniques described herein may be implemented using various semiconductor processing and/or packaging techniques. Some embodiments may be implemented using various types of semiconductor processing techniques associated with semiconductor substrates including, but not limited to, for example, Silicon (Si), Gallium Arsenide (GaAs), Silicon Carbide (SiC), and/or so forth.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present.

Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. A method of forming a semiconductor device, the method comprising:
   disposing a first material stack on a conducting substrate, the first material stack having a first thickness;
   disposing a second material stack on the conducting substrate and apart from the first material stack, the second material stack having a second thickness, the second thickness being different from the first thickness;
   disposing a connecting clip on the first material stack and the second material stack, the connecting clip including a first portion disposed on the first material stack and a second portion disposed on the second material stack; and
   performing a pressure sintering operation by applying pressure, by a top plate of a pressure sintering apparatus, to the connecting clip, the top plate being in substantially simultaneous contact with the first portion and the second portion during the pressure sintering operation.

2. The method as in claim 1, wherein the pressure applied to the connecting clip is applied substantially equally to the first portion and the second portion.

3. The method as in claim 1, wherein the pressure applied is between 2 MPa and 100 MPa.

4. The method as in claim 1, wherein the pressure is applied for a time between 30 seconds and 600 seconds.

5. A method of forming a semiconductor device, the method comprising:
   disposing a first material stack on a conducting substrate, the first material stack having a first thickness;
   disposing a second material stack on the conducting substrate and apart from the first material stack, the second material stack having a second thickness, the second thickness being different from the first thickness; and
   disposing a connecting clip on the first material stack and the second material stack, the connecting clip including a first portion disposed on and aligned along the first material stack and a second portion disposed on and aligned along the second material stack, the first portion having a surface opposite the first material stack and the second portion having a surface opposite the second material stack, the surface of the first portion and the surface of the second portion being at a substantially same perpendicular distance from the surface of the conducting substrate.

6. The method as in claim 5, wherein the surface of the first portion opposite the first material stack is located apart from the surface of the second portion opposite the second material stack.

7. The method as in claim 6, wherein the connecting clip further includes an obtuse-angled shoulder portion in between the first portion and the second portion.

8. The method as in claim 7, wherein the second portion includes a first member, connected to the obtuse-angled shoulder portion, a second member located apart from the first member, and a bridge having a surface included in the surface of the second portion opposite the second material stack, each of the first member and the second member being connected to the bridge.

9. The method as in claim 7, wherein the second portion includes a first foot connected to the obtuse-angled shoulder portion and disposed on the second material stack, a second foot apart from the first foot, and a member in between the first foot and the second foot, the second foot having a surface included in the surface of the second portion opposite the second material stack.

10. The method as in claim 5, wherein the first material stack further includes a first sintering material, a second sintering material, and a semiconductor die, and
   wherein the method further comprises:

disposing a first sintering material on the conducting substrate, disposing a semiconductor die on the first sintering material, and disposing a second sintering material on the semiconductor die.

11. The method as in claim 5, wherein the surface of the first portion and the surface of the second portion are aligned within a plane, the plane being aligned substantially parallel to the conducting substrate.

12. The method as in claim 5, further comprising:

performing a pressure sintering operation by applying pressure, by a top plate of a pressure sintering apparatus, to the connecting clip, the top plate being in substantially simultaneous contact with the first portion and the second portion during the pressure sintering operation.

13. The method as in claim 12, wherein the pressure applied to the connecting clip is applied substantially equally to the first portion and the second portion.

14. The method as in claim 12, wherein the pressure applied is between 2 MPa and 100 MPa.

15. The method as in claim 12, wherein the pressure is applied for a time between 30 seconds and 600 seconds.

16. The method as in claim 5, wherein the connecting clip further includes a bridge portion, a surface of the bridge portion and the surface of the first portion opposite the first material stack forming a continuous surface parallel to the conducting substrate.

17. The method as in claim 16, wherein the second portion includes an acute-angled shoulder connected to the bridge portion and a foot connected to the bridge portion, the foot being disposed on the second material stack.

18. The method as in claim 16, wherein the second portion includes a first member connected to the bridge portion, a second member apart from the first member, and a foot disposed on the second material stack and connected to the first member and the second member.

19. The method as in claim 16, wherein the second portion includes a first foot connected to the bridge portion, a second foot disposed on the second material stack, and a member in between the first foot and the second foot.

20. A method of forming a semiconductor device, the method comprising:

disposing a first material stack on a conducting substrate, the first material stack having a first thickness;

disposing a second material stack on the conducting substrate, the second material stack being separate from the first material stack, the second material stack having a second thickness different from the first thickness; and disposing a connecting clip on the first material stack and the second material stack, the connecting clip including a first portion disposed on and aligned along the first material stack and a second portion disposed on and aligned along the second material stack, the first portion having a surface and the second portion having a surface, the surface of the first portion and the surface of the second portion being aligned within a plane, the plane being aligned parallel to the conducting substrate.

21. The method as in claim 20, wherein a first sintering material of the first material stack is disposed on the conducting substrate, and wherein the method further comprises:

disposing a semiconductor die on the first sintering material, and disposing a second sintering material on the semiconductor die.

22. The method as in claim 20, further comprising:

performing a pressure sintering operation by applying pressure, by a top plate of a pressure sintering apparatus, to the connecting clip, the top plate being in substantially simultaneous contact with the first portion and the second portion during the pressure sintering operation.

23. The method as in claim 22, wherein the pressure applied to the connecting clip is applied substantially equally to the first portion and the second portion.

24. The method as in claim 22, wherein the pressure applied is between 2 MPa and 100 MPa.

25. The method as in claim 22, wherein the pressure is applied for a time between 30 seconds and 600 seconds.

26. A method of forming a semiconductor device, the method comprising:

disposing a first material stack on a conducting substrate, the first material stack having a first thickness;

disposing a second material stack on the conducting substrate and apart from the first material stack, the second material stack having a second thickness, the second thickness being different from the first thickness; and disposing a connecting clip on the first material stack and the second material stack, the connecting clip including a first portion disposed on the first material stack, a second portion disposed on the second material stack, and a connecting portion oriented parallel to the conducting substrate, the connecting portion being disposed between the first portion and the second portion, the second portion including a first foot, a second foot, and a member connecting the first foot and the second foot, the first foot being disposed on the second material stack, the first portion having a surface and the second portion having a surface, the surface of the first portion and the surface of the second portion being aligned within a plane, the plane being aligned parallel to the conducting substrate.

27. The method as in claim 26, wherein a surface of the connecting portion of the connecting clip, a surface of the first portion of the connecting clip, and a surface of the second portion of the connecting clip forms a single surface of contact with a plate of a pressure sintering apparatus.

28. The method as in claim 26, wherein a width of the first foot is substantially equal to a width of the second material stack.

* * * * *